United States Patent
Markert et al.

(10) Patent No.: US 11,393,650 B2
(45) Date of Patent: Jul. 19, 2022

(54) ELECTRONIC ASSEMBLY WITH THERMAL FUSE, AN ELECTRIC MOTOR AND A DRIVE OF A MOTOR VEHICLE

(71) Applicant: BROSE FAHRZEUGTEILE GMBH & CO. KOMMANDITGESELLSCHAFT, WUERZBURG, Wuerzburg (DE)

(72) Inventors: Matthias Markert, Hassfurt (DE); Markus Boehm, Breitenguessbach (DE)

(73) Assignee: BROSE FAHRZEUGTEILE GMBH & CO. KOMMANDITGESELLSCHAFT, Wuerzburg, Wuerzburg (DE)

( * ) Notice: Subject to any disclaimer, the term of this patent is extended or adjusted under 35 U.S.C. 154(b) by 0 days.

(21) Appl. No.: 16/996,241

(22) Filed: Aug. 18, 2020

(65) Prior Publication Data
US 2020/0381205 A1    Dec. 3, 2020

Related U.S. Application Data

(63) Continuation of application No. 16/247,741, filed on Jan. 15, 2019, now Pat. No. 10,784,064, which is a (Continued)

(30) Foreign Application Priority Data
Jul. 15, 2016   (DE) .......................... 102016213019

(51) Int. Cl.
*H01H 85/143*     (2006.01)
*H05K 3/22*       (2006.01)
(Continued)

(52) U.S. Cl.
CPC ........ *H01H 85/143* (2013.01); *H01H 37/761* (2013.01); *H01H 69/02* (2013.01);
(Continued)

(58) Field of Classification Search
CPC .. H01H 85/36; H01H 85/041; H01H 85/0241; H01H 69/02; H01H 37/761;
(Continued)

(56) References Cited

U.S. PATENT DOCUMENTS 530,430 A * 12/1894 Klein ..................... H01H 37/76
                                                                337/403
2,790,049 A *  4/1957 McAlister ............ H01H 37/761
                                                                337/405
(Continued)

FOREIGN PATENT DOCUMENTS

DE  102005014601 A1  10/2006
DE  102010003241 A1  10/2010
(Continued)

OTHER PUBLICATIONS

English Translation of DE 102009046489 (Year: 2011).

*Primary Examiner* — Anatoly Vortman
(74) *Attorney, Agent, or Firm* — Laurence A. Greenberg; Werner H. Stemer; Ralph E. Locher

(57) ABSTRACT

An electronic assembly contains a circuit board having a current-conducting current path with two mutually spaced-apart current path ends that form an interruption point and a contact clip bridging the interruption point. The contact clip is manufactured without a preload, as a thermal fuse. The contact clip has a multiple bent, open clip loop and a contact limb making contact with both mutually spaced-apart current path ends using solder. The contact clip further has a fixing limb with a limb end seated in a circuit board opening. The limb end of the fixing limb is oversized relative to a
(Continued)

circuit board opening, and a deformation being imparted to the contact clip, with an internal preload being generated.

9 Claims, 6 Drawing Sheets

Related U.S. Application Data continuation of application No. PCT/EP2017/067380, filed on Jul. 11, 2017.

(51) Int. Cl.
| | |
|---|---|
| H05K 3/34 | (2006.01) |
| H01H 37/76 | (2006.01) |
| H05K 3/30 | (2006.01) |
| H05K 1/02 | (2006.01) |
| H01H 85/02 | (2006.01) |
| H01H 85/36 | (2006.01) |
| H01H 69/02 | (2006.01) |
| H01H 85/041 | (2006.01) |
| H05K 1/18 | (2006.01) |

(52) U.S. Cl.
CPC ...... *H01H 85/0241* (2013.01); *H01H 85/041* (2013.01); *H01H 85/36* (2013.01); *H05K 1/0263* (2013.01); *H05K 1/181* (2013.01); *H05K 3/222* (2013.01); *H05K 3/308* (2013.01); *H05K 3/3415* (2013.01); *H01H 2037/763* (2013.01); *H01H 2085/0275* (2013.01); *H01H 2235/016* (2013.01); *H05K 1/0292* (2013.01); *H05K 2201/0311* (2013.01); *H05K 2201/09063* (2013.01); *H05K 2201/1059* (2013.01); *H05K 2201/10181* (2013.01); *H05K 2201/10878* (2013.01)

(58) Field of Classification Search
CPC ..... H01H 2235/016; H01H 2085/0275; H01H 2037/763; H05K 1/181; H05K 1/0263; H05K 3/222; H05K 3/308; H05K 3/3415; H05K 2201/10878; H05K 2201/09063; H05K 1/0292; H05K 2201/0311; H05K 2201/10181; H05K 2201/1059
USPC ............... 337/170, 208, 239, 401, 404, 407
See application file for complete search history.

(56) References Cited

U.S. PATENT DOCUMENTS

| | | | | | |
|---|---|---|---|---|---|
| 2,921,167 | A * | 1/1960 | Dahlen | ............... | H01H 85/36 337/181 |
| 3,198,914 | A * | 8/1965 | Baran | ................ | H01H 85/36 337/405 |
| 3,638,083 | A * | 1/1972 | Dornfeld | ............... | H01G 2/14 361/321.1 |
| 3,913,049 | A * | 10/1975 | Burch | ................ | H01H 71/16 337/75 |
| 4,047,143 | A * | 9/1977 | Burden | ............... | H01H 85/36 337/239 |
| 4,486,804 | A * | 12/1984 | Watson | ............... | H01H 85/048 337/239 |
| 4,661,881 | A * | 4/1987 | Watson | ............... | H01H 85/048 337/239 |
| 5,276,422 | A * | 1/1994 | Ikeda | ................ | H01H 77/04 337/28 |
| 5,280,262 | A * | 1/1994 | Fischer | ............... | H01H 37/761 337/402 |
| 5,550,527 | A * | 8/1996 | Lee | .................. | H01C 13/00 310/68 C |
| 5,563,570 | A * | 10/1996 | Lee | .................. | H01C 1/084 310/68 C |
| 5,600,295 | A * | 2/1997 | Kaufmann | ........... | H01H 37/761 337/402 |
| 5,612,662 | A * | 3/1997 | Drekmeier | ........... | H01H 37/761 29/623 |
| 5,770,993 | A * | 6/1998 | Miyazawa | ............... | H01C 7/13 337/142 |
| 5,896,080 | A * | 4/1999 | Chen | .................... | H05K 1/0201 337/407 |
| 5,982,270 | A * | 11/1999 | Wolfe, Jr. | ............... | H01H 37/76 337/165 |
| 6,088,234 | A * | 7/2000 | Ishikawa | ............... | H01H 37/761 174/260 |
| 7,002,785 | B1 * | 2/2006 | Bothe | .................... | H01H 37/76 361/103 |
| 7,023,674 | B2 * | 4/2006 | Gross | ................... | H01H 37/761 337/407 |
| 7,385,474 | B2 * | 6/2008 | Kawanishi | ............. | H01H 37/76 337/142 |
| 7,864,024 | B2 | 1/2011 | Schlenker et al. | | |
| 8,665,057 | B2 * | 3/2014 | Schlenker | ............ | H05K 1/0201 337/407 |
| 8,749,940 | B2 * | 6/2014 | Schmidtlein | ......... | H05K 3/3426 361/103 |
| 9,083,174 | B2 * | 7/2015 | Meyer | ................... | H01H 37/767 |
| 9,620,321 | B2 | 4/2017 | Stoerzinger et al. | | |
| 10,217,594 | B2 * | 2/2019 | Lee | ........................ | H01H 85/08 |
| 2006/0023438 | A1 | 2/2006 | Happoya | | |
| 2007/0296069 | A1 | 12/2007 | Terui et al. | | |
| 2008/0179083 | A1 | 7/2008 | Del Rosario et al. | | |
| 2011/0050386 | A1 | 3/2011 | Schlenker et al. | | |
| 2013/0033355 | A1 * | 2/2013 | Meyer | ...................... | H01T 1/14 337/147 |
| 2013/0062762 | A1 | 3/2013 | Chan et al. | | |
| 2019/0148099 | A1 * | 5/2019 | Markert | ................. | H05K 1/181 337/170 |

FOREIGN PATENT DOCUMENTS

| | | |
|---|---|---|
| DE | 102009046489 A1 | 5/2011 |
| DE | 102014111772 A1 | 2/2016 |
| DE | 202017104268 U1 | 7/2018 ............. H05K 3/341 |
| JP | H08203579 A | 8/1996 |
| JP | 2008535285 A | 8/2008 |
| KR | 101505865 B1 | 3/2015 |
| WO | 2010112389 A1 | 10/2010 |

\* cited by examiner

ELECTRONIC ASSEMBLY WITH THERMAL FUSE, AN ELECTRIC MOTOR AND A DRIVE OF A MOTOR VEHICLE

CROSS-REFERENCE TO RELATED APPLICATION

This application is a continuation of U.S. Ser. No. 16/247,741, filed Jan. 15, 2019, which is a continuation application, under 35 U.S.C. § 120, of copending international application No. PCT/EP2017/067380, filed Jul. 11, 2017, which designated the United States; this application also claims the priority, under 35 U.S.C. § 119, of German Patent Application No. DE 10 2016 213 019.6, filed Jul. 15, 2016; the prior applications are herewith incorporated by reference in their entireties.

BACKGROUND OF THE INVENTION

Field of the Invention

The invention relates to an electronic assembly, in particular for an electric motor of an adjustment system in a motor vehicle, having a circuit board, which has a current-conducting current path with two mutually spaced-apart current path ends, which form an interruption point that is bridged by means of a one-piece contact clip that serves as a thermal fuse.

Electric motor-driven adjustment systems that serve as motor vehicle components, such as for example window regulators, seat adjusters, door and sunroof drives or cooling fan drives, typically have a controlled electric motor. For example, for this purpose, brushless electric motors are known in the art, in which a rotor that is mounted so as to be able to rotate relative to a stator is driven by a rotating magnetic field. For this purpose, phase windings of the stator are subjected to a corresponding electrical rotary or motor current, which is controlled and regulated by an electronic assembly in the form of (motor) electronics.

The electronic assembly typically contains an electronic control unit (the electronics), which often has a spring-loaded thermal fuse that provides overload protection, in the form of a solder joint or connection. In the case of an overload current that flows for a specified time, heat develops at the solder joint. As a result, the solder of the solder joint is melted, so that the conductor is spontaneously interrupted due to the spring tension of the thermal fuse.

Published, non-prosecuted German application DE 10 2005 014 601 A1 discloses an electronic assembly of the above-mentioned kind having a contact clip with a multiple bent, open clip loop. The contact clip has first and second contact limbs that are contacted with the current path ends using solder. One of the contact limbs is seated in a circuit board opening in a manner that is not further specified or described. After circuit board mounting without preload, the contact clip is deformed to generate or produce an internal (mechanical) preload.

In a thermal event, for example, as a result of an overcurrent or an increase in ambient temperature, the solder melts between the circuit board and the contact clip, and the contact clip shifts to its relaxed position. As a result, the power supply to the parts or components is interrupted within the electronics. But in the case of thermal fuses known in the art, it cannot be ensured, and thus cannot be ruled out, that the solder connection of the first or second contact limb of the contact clip will melt in the event of specified thermal events and/or unfavorable heat influence and thus that this contact limb will not be sufficiently fixed to the circuit board or that its position will be uncontrolled.

SUMMARY OF THE INVENTION

The objective of this invention is to provide an electronic assembly (control unit) with a particularly suitable thermal fuse, which in particular may be mounted in a simple manner. In particular, the contact clip thereof should always keep a controlled position on the circuit board, even if the fuse is thermally tripped.

To this end, the electronic assembly (electronic control unit, electronics), in particular the electronic assembly of or for an electric motor, contains a circuit board having a (current-conducting) current path that has two mutually spaced-apart current path ends. Between the current path ends, an interruption point is formed that is bridged by means of a contact clip that serves as a thermal fuse. Suitably, the contact clip is a punched and bent part that is preferably prepared without tension. Particularly suitable as a base material for the process of soldering with the circuit board using surface mounted device (SMD) technology is a copper material with a tin coating.

The contact clip has a multiple bent clip loop that is open toward the circuit board, as well as a contact limb and a fixing limb. The contact limb is contacted with both current path ends using solder, and the current path ends are preferably coated or furnished with a solder pad. The fixing limb, which is preferably not contacted with any of the current path ends, has a limb end that is seated in a circuit board opening. In addition, in final mounting, the fixing limb may also be fixated to the circuit board by means of solder. The fixing limb end is oversized relative to the circuit board opening and is used during mounting in order to orient the position of the contact clip, and thus the thermal fuse, on the circuit board.

In the course of mounting, a deformation is imparted to the contact clip to generate or produce an internal preload (spring preload), and when the contact clip is preloaded by deformation, the end of the fixing limb is preferably pressed into the circuit board opening, i.e. pressed into it during final assembly, in particular in the manner of a press-fit.

The contact clip has a plurality of, preferably at least three, more preferably at least four, bending points forming the clip loop that is open on one side. One of these bending points, which is preferably provided in the region of the loop side facing the fixing limb, acts essentially as a predetermined bending point for the deformation of the contact clip. This predetermined bending point is suitably formed between a loop section that protrudes up from the circuit board and an outward-bent section of the clip loop.

A middle loop section, which is formed from the at least three bending points and between sections of the clip loop that are bent and that rise straight from the circuit board, does not cover the interruption point; rather, it is preferably located next to the interruption point.

If the thermal fuse is tripped, if the solder melts due to a corresponding generation of heat, the contact limb of the contact clip spontaneously lifts up from the circuit board and from both current path ends, as a result of the spring restoring force, due to the internal preload introduced in the course of deformation, so that the current path is interrupted in a particularly reliable fashion. In this case, if tripping occurs, first, there is no contact connection between the contact clip and the current path or the current path ends that flank the interruption point. Second, it is also ensured that, due to the mechanical fixation of the fixing limb in the circuit board or the corresponding circuit board opening, the contact clip does not move to an undefined position, because the heat generation that causes the thermal fuse to be triggered has practically no influence that would release the mechanical connection between the contact clip and the circuit board.

The middle section of the clip loop of the contact clip suitably has a larger section width than the bent loop sections or the contact limbs. In this way, it is advantageously possible that for different current-carrying capacities and/or different power classes, virtually the same punched and bent parts may be used for the contact clip. In this case, only the width of the contact limb, which bridges the interruption point, needs to be adapted with respect to its punch geometry (cross-sectional adaptation). This adaptation may be made using tool inserts in the composite stamping/bending tool. This variant advantageously has no influence on the corresponding activation geometry, and the punch width of the contact clip is the same for all variants.

In a suitable configuration, a preferably slot-like punch opening is introduced into the middle section of the clip loop. This opening expediently extends at least over one of the three bending points of the middle loop section. Particularly advantageously, the punch opening extends from approximately the middle of the middle loop section into the partial loop section that adjoins and bends outward at the fixing limb. As a result, the contact clip may be deformed in a particularly advantageous and in particular well-defined manner for generating an internal preload of the contact clip. In this way a comparatively space-reduced thermal fuse is also generated.

In a particularly advantageous configuration, the fixing limb has a bent limb section and an abutment section that rests on the circuit board, in particular on a solder pad located there. This has a reduced section width relative to the abutment section, and the end of the bent limb section forms the end of the fixing limb that is seated in the circuit board opening. It is particularly suitable for the bent limb section of the fixing limb of the contact clip to be configured approximately in an S-shape.

The bent limb section of the fixing limb suitably forms an abutment or bearing surface for the activation tool, which brings about deformation of the contact clip.

In addition, this limb end is configured to be oversized relative to the circuit board opening, for example, in the manner of a press-fit or in geometrical terms in the manner of an obtuse arrowhead.

It is particularly advantageous for the bent limb section of the fixing limb to be S-shaped. Due to the preferred S-shape of the limb section, a particularly expedient abutment or bearing surface is formed for the activation tool that brings about deformation of the contact clip, in which the clip loop is deformed to produce an internal preloading of the contact clip and, preferably simultaneously, the end of the fixing limb is pressed into the corresponding circuit board opening at the same time that the S-shaped limb section is deformed.

The advantages achieved by the invention are in particular that it makes it possible for an electronic assembly to be fixated as an SMD component without using additional individual components, by means of an one-piece contact clip that serves as a thermal fuse. Both the fixing of the contact clip onto the circuit board, and the activation of the contact clip by the deformation thereof for producing the internal spring preload, take place from the same mounting direction. In addition, the thermal fuse realized in this way is particularly space- and cost-efficient. The realization of different performance classes is made possible by a tool, in which the corresponding variance in the width of the contact limb of the contact clip may be realized by tool inserts.

To begin with, the reliable positional orientation of the contact clip is particularly advantageous during circuit board mounting. And in addition, after press-fit mounting of the end of the fixing limb in the corresponding circuit board opening, a particularly reliable mechanical fixation of the position of the thermal fuse is achieved, irrespective of thermal influences.

The mounting of the contact clip and thus the thermal fuse, including the activation thereof by generating the internal preload of the contact clip, may particularly advantageously be accomplished by means of the same activation tool, because the tool may be furnished and used both on the clip loop for deforming the contact clip and at the end of the fixing limb for interference-fitting the same into the circuit board opening. Reliable fixation of the contact clip may also be achieved by the fixing limb end, because this limb end, which serves to produce a press fit, is suitably a component of the contact clip. In this case, the advantageously S-shaped limb section is suitably materially connected to the fixing limb and thus also is an integral part of the contact clip, which is preferably produced as a punched and bent part.

Other features which are considered as characteristic for the invention are set forth in the appended claims.

Although the invention is illustrated and described herein as embodied in an electronic assembly with a thermal fuse, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
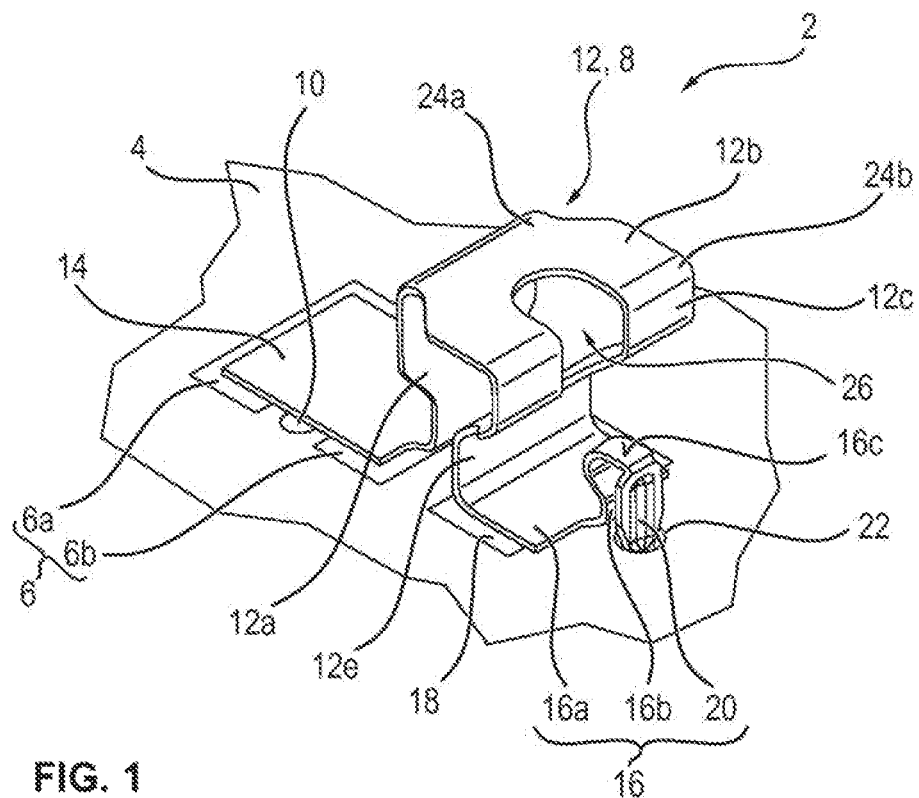
FIG. 1 is a diagrammatic, perspective view of an electronic assembly with a circuit board that has a current-conducting current path with two mutually spaced-apart current path ends that form a interruption point that is bridged by a one-piece contact clip serving as a thermal fuse according to the invention.

Matching parts and sizes are always assigned the same reference numerals in all drawings.

Referring now to the figures of the drawings in detail and first, particularly to FIG. 1 thereof, there is shown an electronic assembly 2 of an electric motor, not otherwise shown, for an adjusting drive of a motor vehicle. The assembly 2 contains a circuit board 4 equipped with non-illustrated electrical parts; a detail of a current path 6 is shown. The current path 6 additionally has a thermal fuse 8. The thermal fuse 8 protects the electric motor from the risk of overheating and fire during operation. If the electric motor overheats, the thermal fuse 8 is tripped, thereby interrupting the flow of current to the electric motor.

The thermal fuse 8 connects the current path ends 6a and 6b, which conduct the motor current, via an interruption point 10 of the current path 6. In the exemplary embodiment of FIG. 1, the interruption point 10 is formed between the current path ends 6a and 6b, in particular by a slot-like recess of the circuit board 4. The thermal fuse 8 is implemented as a contact clip, and will also be referred to as a contact clip hereinafter.

The contact clip 8 is a punched and bent part with a multiple bent, open clip loop 12, which is implemented on the loop end by both a contact limb 14 and a fixing limb 16. As may be seen comparatively clearly in FIGS. 1 to 3, the contact limb 14 extends over the interruption point 10 in the manner of a bridge. In other words, the interruption point 10 between the current path ends 6a and 6b is bridged only by the contact limb 14.

In the (untripped) mounted state, the tab-like contact limb 14 is attached to both the current path end 6a and the current path end 6b, by means of a respective solder connection. The solder joints formed as a result electrically contact the current path ends 6a and 6b via the contact limb 14, and mechanically connect the contact limb 14 to the circuit board 4.

The contact clip 8 is preferably made from a copper material with a tin coating, without preloading, so that the solder connections of the contact limb 14 with the current path ends 6a and 6b may be produced, particularly in an SMD technique. In this case, the dimensioning of the limb or section width of the contact limb 14 is adapted to the strength of the motor current in normal operation. This means that the electrically-generated heating of the contact limb 14 in normal operation is not sufficient to melt the solder joints between the current path ends 6a and 6b.

Figure 2:
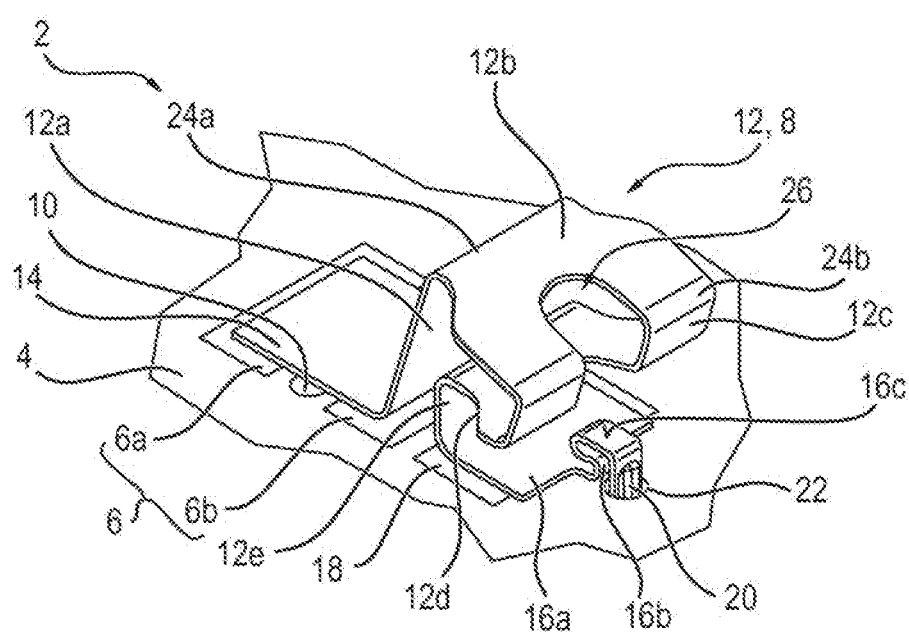
FIG. 2 is a perspective view of the contact clip in a deformed and tensioned state, depicted according to FIG. 1.

To realize the fuse function of the contact clip 8, after the contact clip 8 is first mounted on the circuit board without preload, it is deformed in order to generate or produce an internal (mechanical) preload (FIG. 2).

Figure 4:
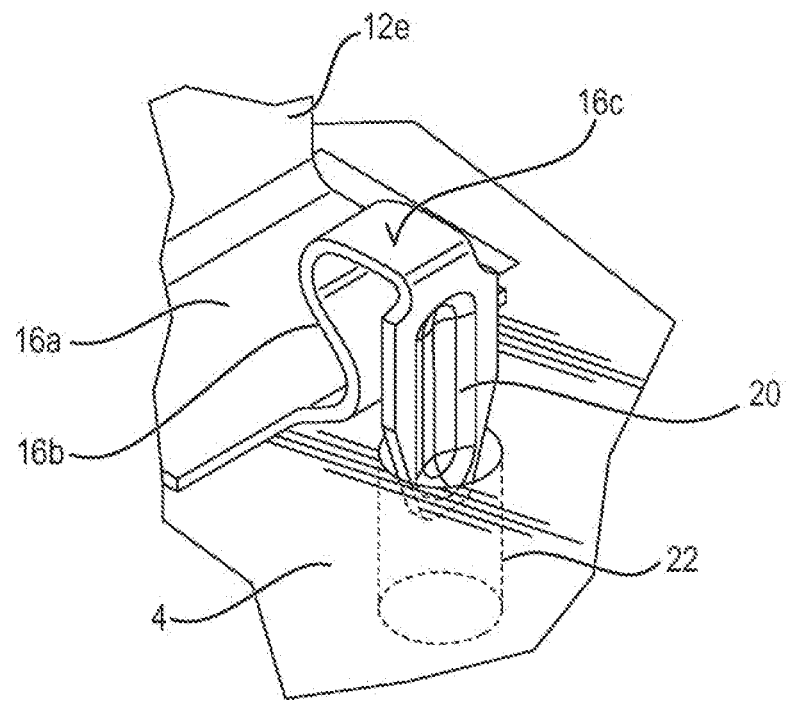
FIG. 4 is a perspective view of a fixing limb of the contact clip for press-fit fastening into a circuit board opening.

When mounted, by means of the fixing limb 16, the contact clip 8 is mechanically connected to a solder pad 18 via a solder connection. The fixing limb 16 also has a tongue-shaped limb end 20. The limb end 20, shown in greater detail in FIG. 4, may be inserted into a cylindrical circuit board opening 22 in order to fasten the contact clip 8 to the circuit board 4. The limb end 20 in this case has a limb width that is prepared to be at least partially oversized relative to the diameter of the circuit board opening 22. For purpose of attachment, the limb end 20 is pressed into the circuit board opening 22.

Figure 3:
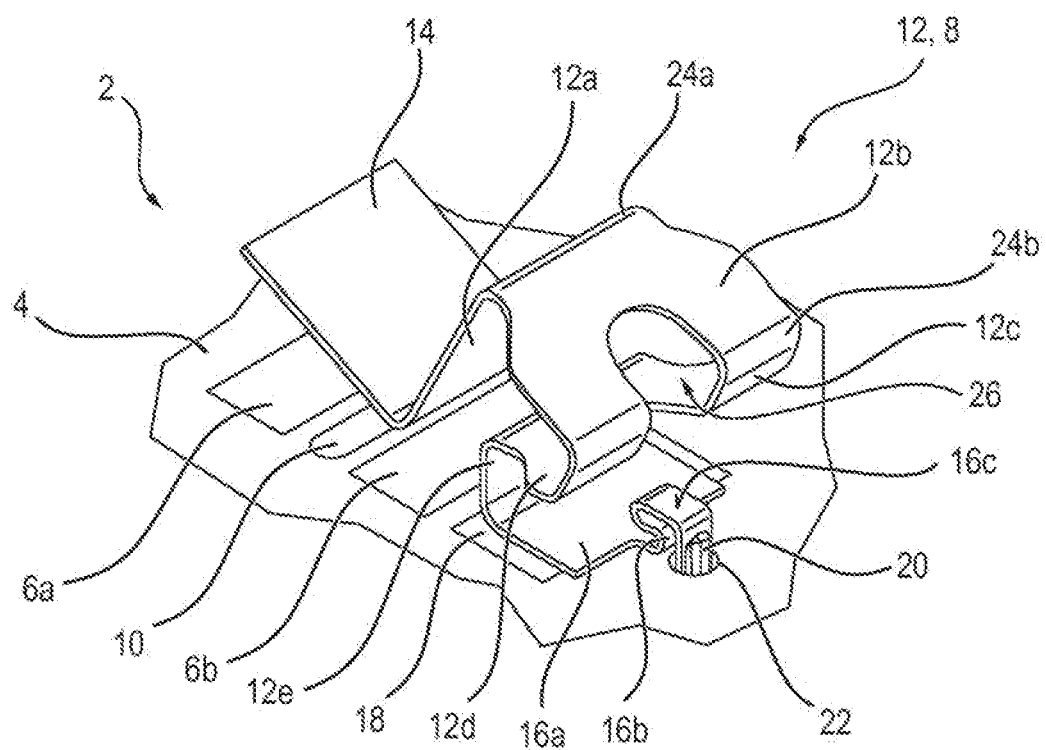
FIG. 3 is a perspective view of the contact clip with the thermal fuse in a tripped state, depicted according to FIG. 1.

In the event that the fuse is tripped and the heat melts the solder joints between the current path ends 6a and 6b and the contact limb 14, as well as the solder joint between the solder pad 18 and the fixing limb 16, the contact limb 14 pivots into a non-contacting position due to the preloading of the contact clip 8 (FIG. 3). Mechanical fixation by the limb end 20 ensures that the contact clip 8 is always held in a defined position on the circuit board 4, even if the fuse is tripped.

The mounting of the contact clip 8 is explained in more detail below, with reference to FIGS. 5 to 8.

As may be seen comparatively clearly in the side views of FIGS. 5 to 8, in this exemplary embodiment the contact clip 8 has substantially four bending points 24a, 24b, 24c, and 24d forming the clip loop 12. The bending points 24a, 24b, 24c, and 24d form substantially five subsections of the clip loop 12, which are also referred to below as loop sections 12a, 12b, 12c, 12d, and 12e. Loop section 12a in this case merges integrally or monolithically into the contact limb 14, and the loop section 12e merges integrally or monolithically into the fixing limb 16. The clip loop 12 has, in each of these transition areas respectively, a bending point that is not further specified, by which the clip loop 12 of the circuit board 4 stands substantially straight up.

Figure 5:
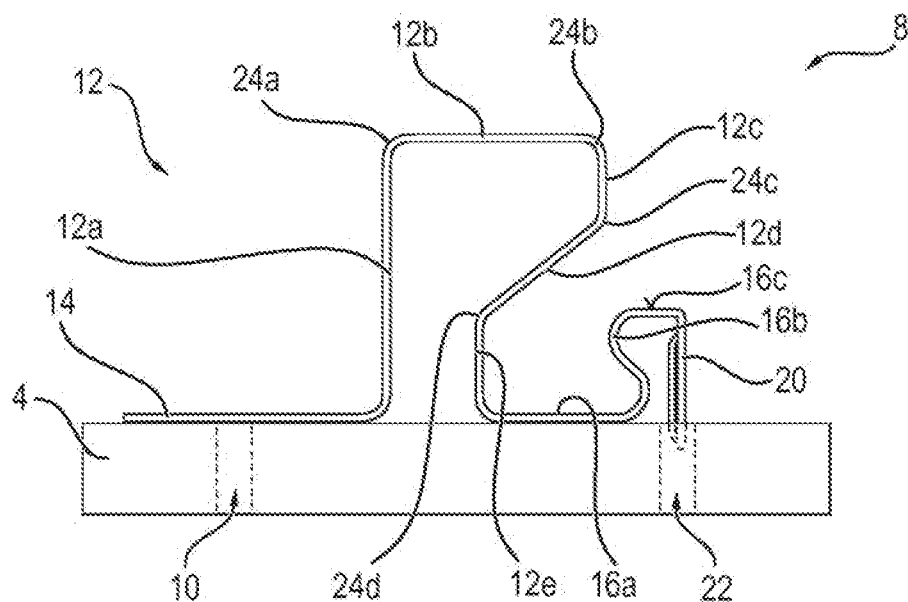
FIGS. 5 to 8 show a side view of the deformation and preloading of the contact clip.

When the contact clip 8 is untensioned as shown in FIG. 5, loop sections 12a and 12e are oriented substantially perpendicular to the circuit board 4. The loop sections 12a and 12e are arranged parallel to each other and spaced apart, forming a loop opening that is oriented toward the circuit board 4. The comparatively long loop section 12a transitions into the loop section 12b by means of the substantially right-angled bending point 24a. The loop section 12b, in this case, is oriented parallel to the circuit board 4.

The bending point 24b between the loop sections 12b and 12c has a substantially perpendicular bending angle. As a result, the loop section 12c is oriented substantially parallel to loop sections 12a and 12e. In particular, "bending angle" hereinafter refers to the angle of bending of a bending point. This is the included angle between two adjacent loop sections, wherein in particular the angles within the loop contour of the clip loop 12 are referred to as bending angles.

The bending point 24c between the loop sections 12c and 12d has an obtuse bending angle, i.e., a bending angle between 90° and 180°. As a result, loop section 12d has a tilt or slant relative to the circuit board 4 until it reaches the bending point 24d. The bending point 24d in this case has a reflex bending angle, i.e., a bending angle greater than 180°.

The exemplary embodiment of the contact clip 8 in FIGS. 1 to 4, in this case, has two additional bending points, not further specified, in the region of the loop section 12d; by means of these, in the course of preloading a step-like shoulder is formed that serves as a predetermined bending point. In addition, a slot-like punch opening 26 is inserted into the clip loop 12. As may be seen in particular in FIGS. 1 to 3, the punch opening 26 extends substantially from the loop section 12c, via the bending point 24b, the loop section 12d and the bending point 24c, to the loop section 12d.

Loop sections 12a and 12e form a bent section of the clip loop 12, and the loop sections 12b, 12c and 12d substantially form a middle section or region of the clip loop 12 arranged between these sections. As may be seen in FIGS. 1 to 3, this middle section has a greater width relative to the contact limb 14 and fixing limb 16. The punch opening 26 is introduced in the area of this increased section width.

The fixing limb 16 has an abutment section 16a that is fastened to the solder pad 18, and also has a bent limb section 16b. The limb section 16b has—as shown in particular in FIGS. 1 to 4—a reduced section or limb width relative to the abutment section 16a. The limb section 16b turns into the limb end 20 on the free end side. The limb section 16b in this case has a substantially S-shaped bending contour between the abutment section 16a and the limb end 20.

Figure 6:
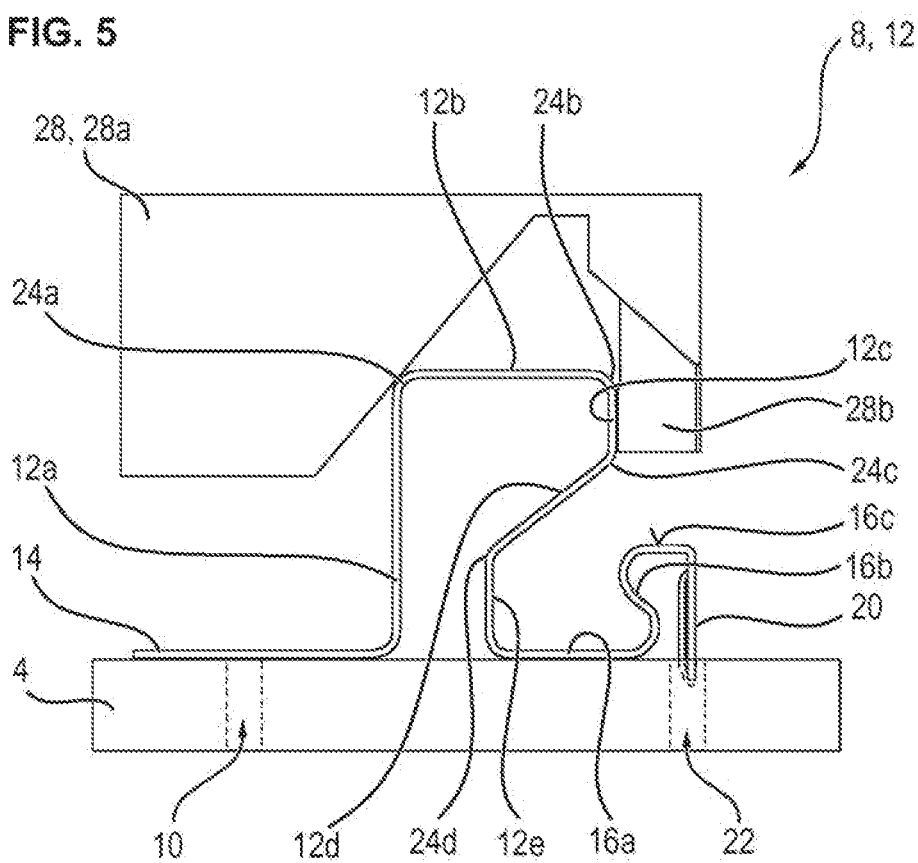
Figure 7:
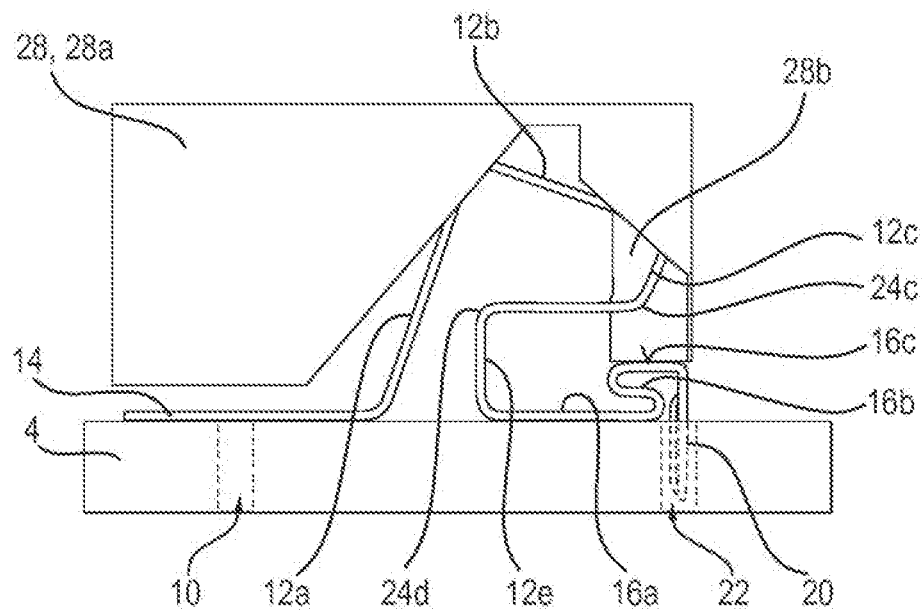

During mounting, a deformation is imparted to the contact clip 8 by generating or producing an internal preload (spring preload) by means of an activation tool or a punch 28 (FIG. 6, FIG. 7). During deformation, the bending point 24d serves as a predetermined bending point of the contact clip 8.

Figure 8:
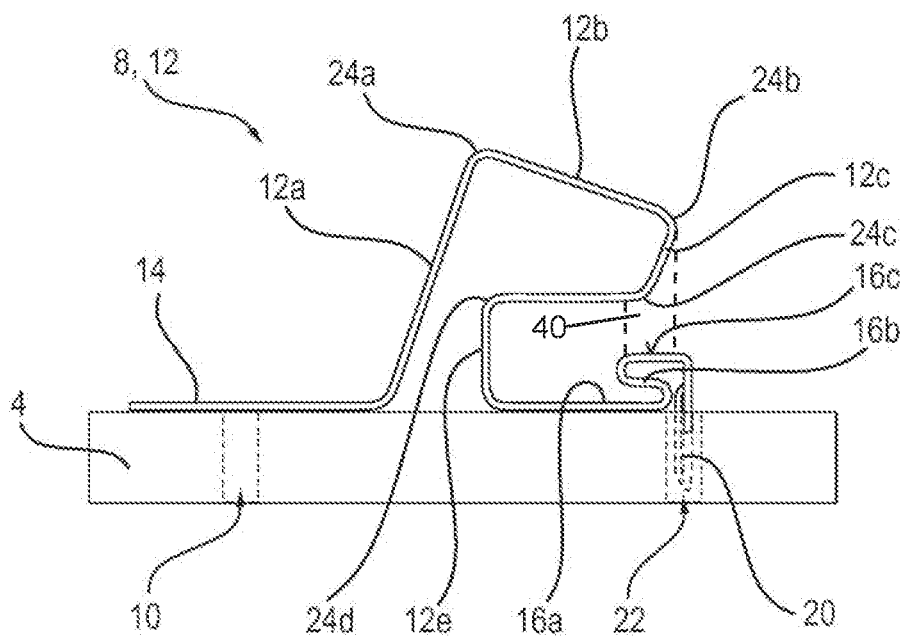

As shown in FIGS. 7 and 8, the bending angle of the bended part 24d is bent to a reflex angle of about 270 degrees, so that the loop section 12d is oriented substantially parallel to the circuit board 4. In the course of deformation, the bending point between the loop section 12a and the contact limb 14 is bent in such a way that the loop section 12a extends at an oblique angle with respect to the circuit board 4.

During the deformation or preloading process, and preferably simultaneously, the end 20 of the fixing limb 16 is pressed into the circuit board opening 22 and thus fastened therein during the final assembly (FIG. 8), particularly in the manner of a press fit. For this purpose, the punch 28 presses on a horizontal S-limb of the limb section 16b that is spaced from the circuit board 4. In other words, the horizontal S-limb acts as an abutment or bearing surface 16c for the punch 28. The punch 28 deforms the limb section 16b in such a way that the S-shaped contour of the limb section 16b is compressed or pressed together (FIG. 7). As a result, the limb end 20 is simultaneously pressed into the circuit board opening 22.

For mounting the contact clip 8, the punch 28 substantially has a first punch area 28a for deforming and preloading the clip loop 12 and a second, extension-type punch area 28b for deforming the fixing limb 16 and simultaneously pressing the limb end 20 into the circuit board opening 22. When the clip loop 12 is deformed, it is bent in such a way that the loop sections 12b, 12c and 12d at least partially overlap the fixing limb 16 and the punch opening 26 is disposed in a projection region 40 projecting over the fixing limb 16. The punch opening 26 serves as a recess for the punch area 28b, so that the punch area reliably acts on the fixing limb 16. In other words, as shown in FIG. 7, the punch area 28b is at least partially located within the punch opening 26 of the clip loop 12. This means that the punch opening 26 provides a clearance for the activation tool 28, which is advantageous for mounting.

Figure 9:
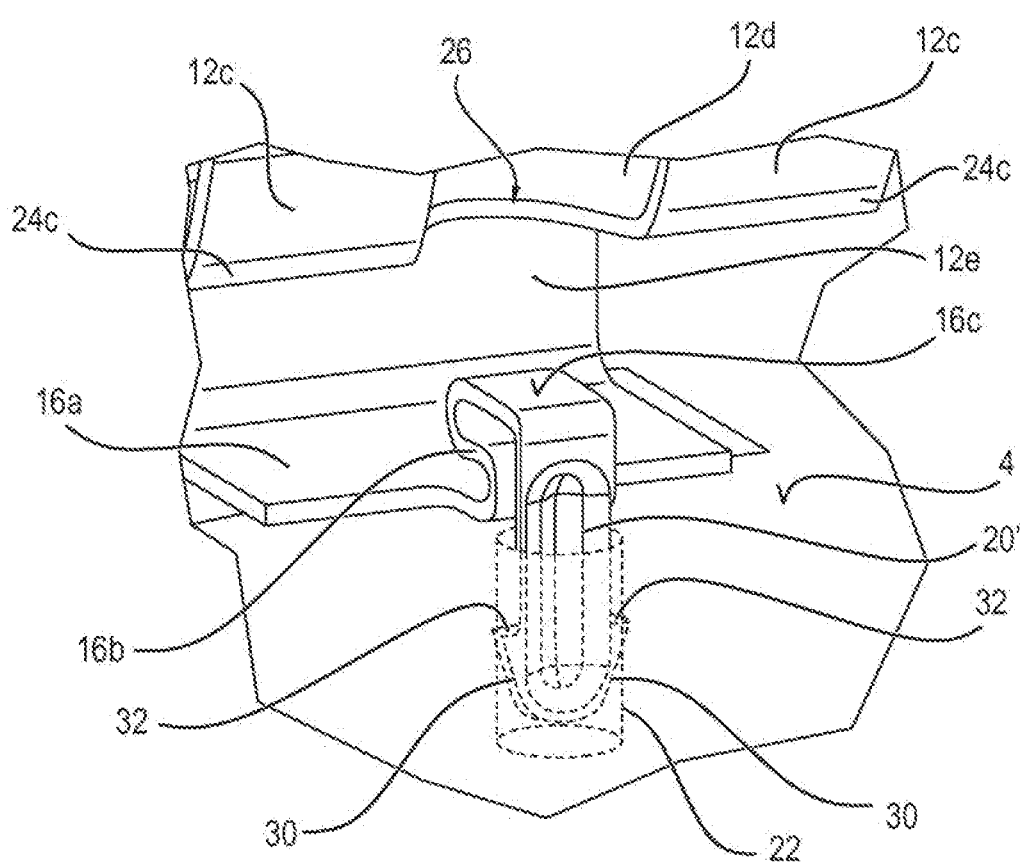
FIG. 9 is a perspective view of a first alternative configuration of the fixing limb, in a representation according to FIG. 4.

In the exemplary embodiment of FIG. 9, an alternative configuration is shown of the fixing limb 16 and the limb end 20' when pressed into the circuit board opening 22. In this exemplary embodiment, the limb end 20' is, in geometrical terms, designed substantially as an obtuse arrowhead. The limb end 20', which is shaped roughly like the tip of the arrow, in this case has two inclined outer sides or vanes 30 that extend from the obtuse tip to a tip base 32. The tip base 32 in this case is oversized relative to the circuit board opening 22 for the press-fit attachment.

Figure 10:
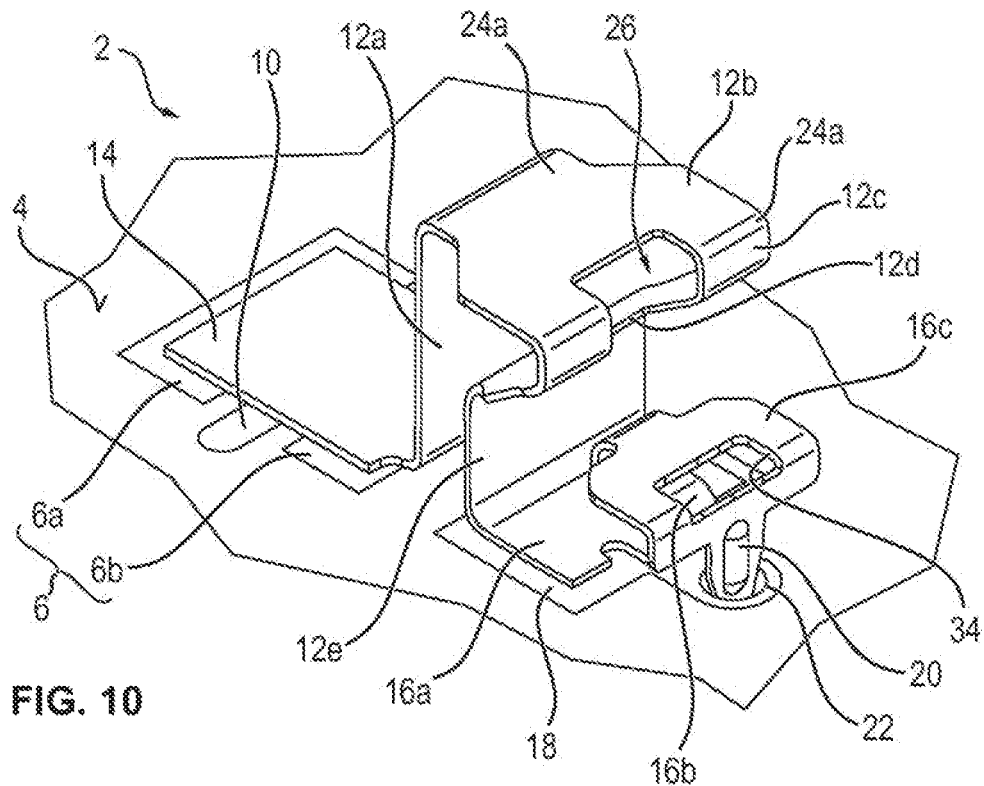
FIG. 10 is a perspective view of the assembly with a second alternative configuration of the fixing limb.
Figure 11:
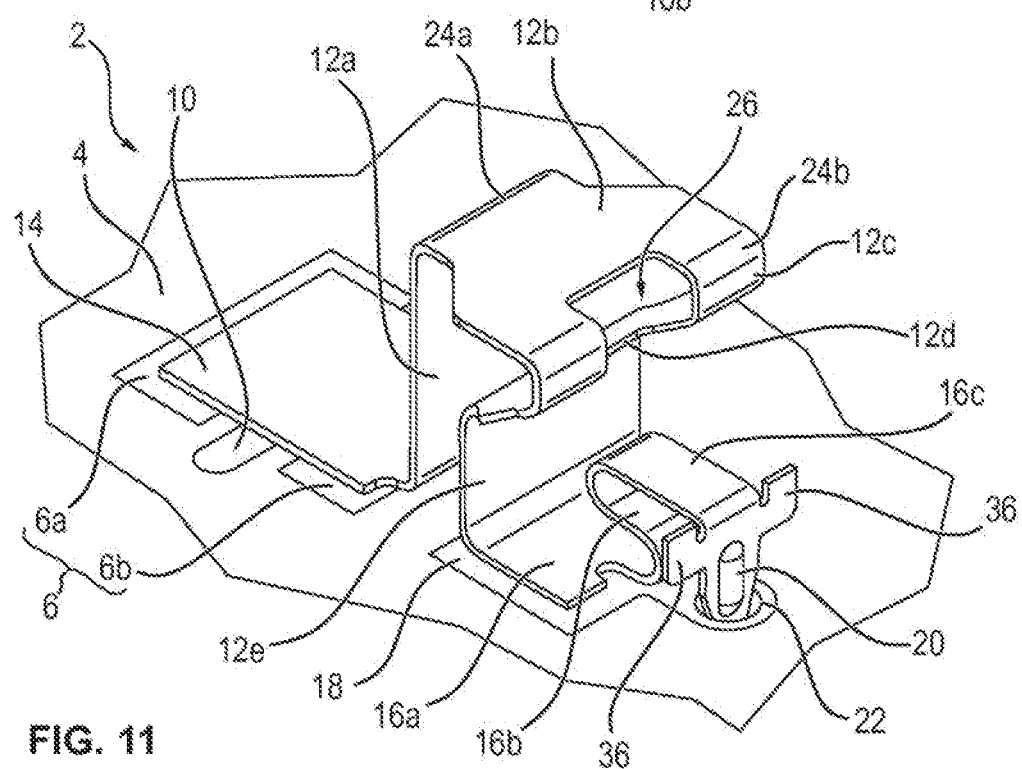
FIG. 11 is a perspective view of the assembly with a third alternative configuration of the fixing limb.

FIGS. 10 and 11 show two further configurations of the fixing limb 16, with the contact clip 8 in a partially assembled state. In these exemplary embodiments, the circuit board opening 22 is bordered at least partially by the solder pad 18.

In the exemplary embodiment of FIG. 10, the fixing limb 16 has a widened abutment surface 16c for the punch section 28a. This simplifies the pressing of the limb end 20 into the circuit board opening 22. In this case, a punch opening 34 is introduced into the abutment surface 16c.

The exemplary embodiment of FIG. 11 shows a fixing limb 16 with a limb end 20, which has two punch tabs 36 that protrude circumferentially in the region of the abutment surface 16c. The limb end 20 thus has a substantially T-shaped configuration, with the punching tabs 36 forming the horizontal limb of the T and the shaft that may be pressed into the circuit board opening 22 forming the vertical limb of the T. The punch tabs 36 improve the effect of force when pressing into the circuit board opening 22. In this way, the ability to fold the approximately S-shaped limb section 16b during mounting is improved.

The invention is not limited to the above-described exemplary embodiments. Rather, other variants of the invention may also be derived therefrom by a person of ordinary skill in the art, without departing from the subject matter of the invention. In particular, all the individual features described in connection with the exemplary embodiments may also be combined with each other in other ways, without departing from the subject matter of the invention.

The following is a summary list of reference numerals and the corresponding structure used in the above description of the invention:

2 Assembly
4 Circuit board
6 Current path
6a, 6b Current path end
8 Thermal fuse/contact clip
10 Interruption point
12 Clip loop
12a, 12b, 12c, 12d, 12e Loop section
14 Contact limb
16 Fixing limb
16a Abutment section
16b Limb section
16c Abutment surface, bearing surface
18 Solder pad
20, 20' Limb end
22 Circuit board opening
24a, 24b, 24c, 24d Bending point
26 Punch opening
28 Activation tool/punch
28a, 28b Punch area
30 Vane/outer side
32 Tip base
34 Punch opening
36 Punch tab

The invention claimed is:

1. An electronic assembly, comprising:
a circuit board having a current-conducting current path with two mutually spaced-apart current path ends that form an interruption point, said circuit board having a circuit board opening formed therein;
a contact clip bridging said interruption point, said contact clip being manufactured without a preload, as a thermal fuse, said contact clip having a multiple bent, open clip loop and a contact limb making contact with both mutually spaced-apart current path ends using solder, said contact clip further having a fixing limb with a limb end seated in said circuit board opening, said limb end of said fixing limb being oversized relative to said circuit board opening, and a deformation being imparted to said contact clip, with an internal preload being generated; and
said open clip loop having between said contact limb and said fixing limb, bent loop sections and a middle loop section with at least three bending points, said middle loop section of said open clip loop having a larger section width than said contact limb and/or said fixing limb, wherein said middle loop section of said open clip loop having a punch opening formed therein, said punch opening extending over at least one of said at least three bending points of said middle loop section, said middle loop section projecting over said fixing limb in a deformed/preloaded state such that said punch opening being disposed in a projecting region projecting over said fixing limb.

2. The electronic assembly according to claim 1, wherein said limb end of said fixing limb is pressed into said circuit board opening when said contact clip is preloaded as a result of being deformed.

3. The electronic assembly according to claim 1, wherein said bent loop sections include a loop section facing said fixing limb, said loop section forming a predetermined bending point for deforming said contact clip.

4. The electronic assembly according to claim 1, wherein said fixing limb has an abutment section that rests on said circuit board, and also has a bent limb section having a reduced section width relative to said abutment section, and an end of said bent limb section forms said limb end that is seated in said circuit board opening.

5. The electronic assembly according to claim 1, wherein said fixing limb has an S-shaped bent limb section.

6. The electronic assembly according to claim 5, wherein said S-shaped bent limb section of said fixing limb forms an abutment or bearing surface for an activation tool that generates the deformation of said contact clip.

7. The electronic assembly according to claim 4, wherein said abutment section rests on a solder pad of said circuit board.

8. An electric motor of an adjustment system, comprising:
an electronic assembly, containing:
a circuit board having a current-conducting current path with two mutually spaced-apart current path ends that form an interruption point, said circuit board having a circuit board opening formed therein;
a contact clip bridging said interruption point, said contact clip being manufactured without a preload, as a thermal fuse, said contact clip having a multiple bent, open clip loop and a contact limb making contact with both mutually spaced-apart current path ends using solder, said contact clip further having a fixing limb with a limb end seated in said circuit board opening, said limb end of said fixing limb being oversized relative to said circuit board opening, and a deformation being imparted to said contact clip, with an internal preload being generated; and
said open clip loop having between said contact limb and said fixing limb, bent loop sections and a middle loop section with at least three bending points, said middle loop section of said open clip loop having a larger section width than said contact limb and/or said fixing limb, wherein said middle loop section of said open clip loop having a punch opening formed therein, said punch opening extending over at least one of said at least three bending points of said middle loop section, said middle loop section projecting over said fixing limb in a deformed/preloaded state such that said punch opening being disposed in a projecting region projecting over said fixing limb.

9. A drive of a motor vehicle, comprising:
an electronic assembly, containing:
a circuit board having a current-conducting current path with two mutually spaced-apart current path ends that form an interruption point, said circuit board having a circuit board opening formed therein;
a contact clip bridging said interruption point, said contact clip being manufactured without a preload, as a thermal fuse, said contact clip having a multiple bent, open clip loop and a contact limb making contact with both mutually spaced-apart current path ends using solder, said contact clip further having a fixing limb with a limb end seated in said circuit board opening, said limb end of said fixing limb being oversized relative to said circuit board opening, and a deformation being imparted to said contact clip, with an internal preload being generated; and
said open clip loop having between said contact limb and said fixing limb, bent loop sections and a middle loop section with at least three bending points, said middle loop section of said open clip loop having a larger section width than said contact limb and/or said fixing limb, wherein said middle loop section of said open clip loop having a punch opening formed therein, said punch opening extending over at least one of said at least three bending points of said middle loop section, said middle loop section projecting over said fixing limb in a deformed/preloaded state such that said punch opening being disposed in a projecting region projecting over said fixing limb.

* * * * *